United States Patent [19]

Weiner et al.

[11] 4,272,725

[45] Jun. 9, 1981

[54] INTERFACE CIRCUIT FOR USE WITH ELECTRONIC CONTROL DEVICES

[75] Inventors: Nathan K. Weiner, Stoughton; David D. Ketchum, Ipswich, both of Mass.

[73] Assignee: Electronics Corporation of America, Cambridge, Mass.

[21] Appl. No.: 35,534

[22] Filed: May 3, 1979

[51] Int. Cl.$^3$ .............................................. G01R 31/02

[52] U.S. Cl. .................................. 324/415 R; 324/51; 324/52

[58] Field of Search ..................... 324/51, 52, 421, 72, 324/55, 415 R; 328/135, 151

[56] References Cited

U.S. PATENT DOCUMENTS 3,774,106 11/1973 MacPhee .............................. 324/51

3,869,664 3/1975 Safer et al. ............................ 324/51

*Primary Examiner*—David K. Moore

*Attorney, Agent, or Firm*—Charles E. Pfund

[57] ABSTRACT

An interface circuit for indicating the state of a set of switch contacts having high noise immunity and high reliability. The switch contacts to be monitored are connected in series with the primary winding of a transformer having a magnetic core with a highly rectangular hysteresis loop. A voltage is periodically applied through the switch to the transformer primary. A test pulse of current is then passed through a secondary winding on the transformer. The signal across the secondary winding produced in response to the test pulse current indicates the closed or opened condition of the contacts.

34 Claims, 6 Drawing Figures

INTERFACE CIRCUIT FOR USE WITH ELECTRONIC CONTROL DEVICES

FIELD OF THE INVENTION

The present invention is concerned with isolation circuits and in particular with isolation circuits for detecting the state of switch or relay contacts in the field.

BACKGROUND OF THE INVENTION

In designing electronic circuitry, an interface circuit is frequently used to provide an output signal representative of the open or closed state of a remotely-located set of switch contacts while maintaining electrical isolation between the switch contacts and the output signal. In burner control systems, for example, a large number of switches monitor various conditions in the burner installation. The states of these switches must be provided to the burner control circuitry while maintaining electrical isolation between the switches and the control circuitry, to prevent possible damage to the control circuitry. In addition to providing isolation, the interface circuit must provide a high degree of noise immunity. Especially in field situations, switch contacts are frequently contaminated by dirt and may go long periods between maintenance. Such operational conditions impose stringent requirements on the interface circuitry.

To test the open or closed state of a set of field located contacts, a moderately high current may be passed through these contacts. Contamination of the contacts generally results in a high resistance shunt around the contacts, and this contamination cannot pass the high current levels necessary to provide an indication of a closed contact state. Additionally, the high current level provides an increased noise immunity to spurious signals capacitively coupled to the contacts or interconnecting cabling.

Although several techniques are known in the prior art for providing such interface circuits, these techniques have several drawbacks. Relays may be used to provide isolation between circuits connected to the relay coil and contacts. However, the cost and size of relays makes them uneconomical for situations in which a large number of contacts must be monitored. Additionally, relays have a finite contact life and require periodic maintenance. Optical isolators or photocouplers are frequently used to detect the state of switch contacts. Currently available optical isolator circuits are semiconductor devices whose parameters are extremely variable. The gain through an optical isolator may vary over a 10:1 ratio, for example. This results in more complicated circuit designs and frequently requires some sort of in-circuit adjustment. Additionally, the reliability of semiconductor devices declines when they are exposed to certain extreme environmental conditions of heat or high voltages.

SUMMARY OF THE INVENTION

The present invention provides an interface circuit for indicating the state of a set of switch contacts. The interface circuit provides high noise immunity, low cost, and very high reliability. In the present invention, the primary winding of a transformer is connected in series with the switch contacts to be monitored. The transformer has a magnetic core with a highly rectangular hysteresis loop.

A voltage is periodically applied through the switch to the transformer primary. If the contacts are closed, a pulse of current passes through the primary winding. After the current returns to zero the core remains magnetized. A test pulse of current is then passed through a secondary winding on the transformer in a direction to magnetize the core in the opposite sense. If the switch contacts were previously closed, there is a large and rapid flux change as the core magnetization is reversed by the test pulse current. This flux change is detected by observing the time-voltage product of the signal across the secondary winding.

If the contacts open, the core is magnetized by the first succeeding test pulse. Subsequent test pulses will cause a very small change in the flux, and the output signal across the secondary winding is correspondingly much smaller. The signal across the secondary winding produced in response to the test pulse current is used to set a flip-flop or other device to the appropriate state to indicate the closed or opened condition of the contacts.

The present invention may be manufactured very compactly and economically. Additionally, transformers are inherently extremely reliable devices and provide a high degree of isolation between the switch contacts and the circuitry responsive to the interface output signal. Strobing the interface circuit allows a large current to be passed through the contacts while maintaining a relatively average low power consumption. The strobing of the switch contacts and transformer also results in high noise immunity.

DESCRIPTION OF THE DRAWINGS

These and other advantages of the present invention will become more clear upon reading the following description of the preferred embodiment in conjunction with the accompanying drawings of which.

DESCRIPTION OF THE PREFERRED EMBODIMENTS

Figure 1:
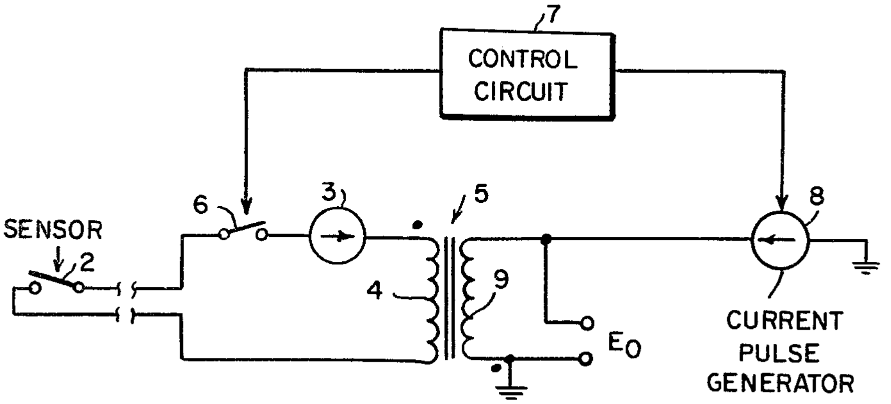
FIG. 1 is a block diagram of the invention.

Referring to FIG. 1, there is shown a simplified circuit which illustrates the principle of operation of the present invention. A switch 2 represents a set of contacts which may, for example, be actuated by a sensor and which are opened or closed in response to a condition to be monitored. Typically, sensor switch 2 is remotely located and connected to the remainder of the circuitry by means of a cable or other interconnecting wiring which may be susceptible to inductively and capacitively coupled noise. Also, sensor switch 2 may be in a hostile environment which results in contamination or other conditions producing leakage across the switch contacts.

Sensor switch 2 is connected in series with a current source 3 and a primary winding 4 of a transformer 5. A second control switch 6 or other means for interrupting current is in series with current source 3 and sensor switch 2. Control switch 6 is responsive to signals from a control circuit 7 and is periodically closed to test the condition of switch 2. When switch 2 is closed, current flows through the primary winding 4 of transformer 5.

A secondary winding 9 of transformer 5 is connected in series with a current pulse generator 8. Current pulse generator 8 is also responsive to signals from control circuit 7 and periodically applies test current pulses to the secondary winding 9 of transformer 5, following the closing and opening of switch 6. The polarities of the primary and secondary windings of transformer 5 are such that current sources 3 and 8 tend to magnetize the core in opposite directions.

Figure 2:
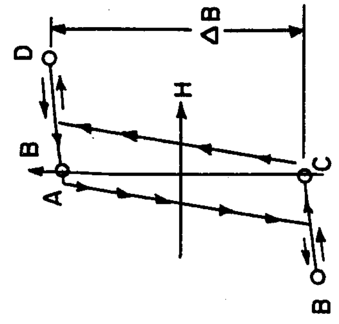

The core of transformer 5 is made of a material which has a highly rectangular hysteresis loop. FIG. 2 shows an idealized BH curve for transformer 5. The currents through the primary and secondary windings of transformer 5 from current source 3 and pulse generator 8 are large enough to cause the transformer core to saturate.

The output voltage $E_o$ across secondary winding 9 in response to a test current pulse from pulse generator 8 is given by the following equations:

$$E_o = NA(dB/dt) \quad (1)$$

or $$E_o \Delta t = NA\Delta B \quad (2)$$

Where N equals the number of secondary turns, A equal the area of the core cross-section, and B equals the flux density. Thus, the voltage-time product of the output pulse is proportional to the change in flux.

The operation of the circuit of FIG. 1 may be more easily described by referring to FIG. 2. Following a test current pulse from pulse generator 8, the transformer core is magnetized at point A on the hysteresis loop in FIG. 2. Assume that switch 2 is closed. When control circuit 7 briefly closes switch 6, the current flowing through the primary winding 4 of the transformer saturates the transformer core, traversing the path AB on the hysteresis loop. The core remains magnetized at point C after switch 6 opens. Next, pulse generator 8 is triggered, and current flows through secondary winding 9 in the proper direction to reverse the flux in the core. The core now rapidly traverses the path CD on the hysteresis loop. The large change in flux in the core, $\Delta B$, produces a large voltage-time product as the output signal $E_o$ across secondary winding 9.

On the other hand, if sensor switch 2 is open, no current can flow through primary winding 4 when switch 6 is momentarily closed. In this case, the core remains saturated at point A in FIG. 2 in the direction of the last test pulse from current generator 8. When pulse generator 8 is next enabled by control circuit 7, there is no significant change in the flux; and the output voltage from secondary winding 9 is correspondingly much smaller.

Figure 3:
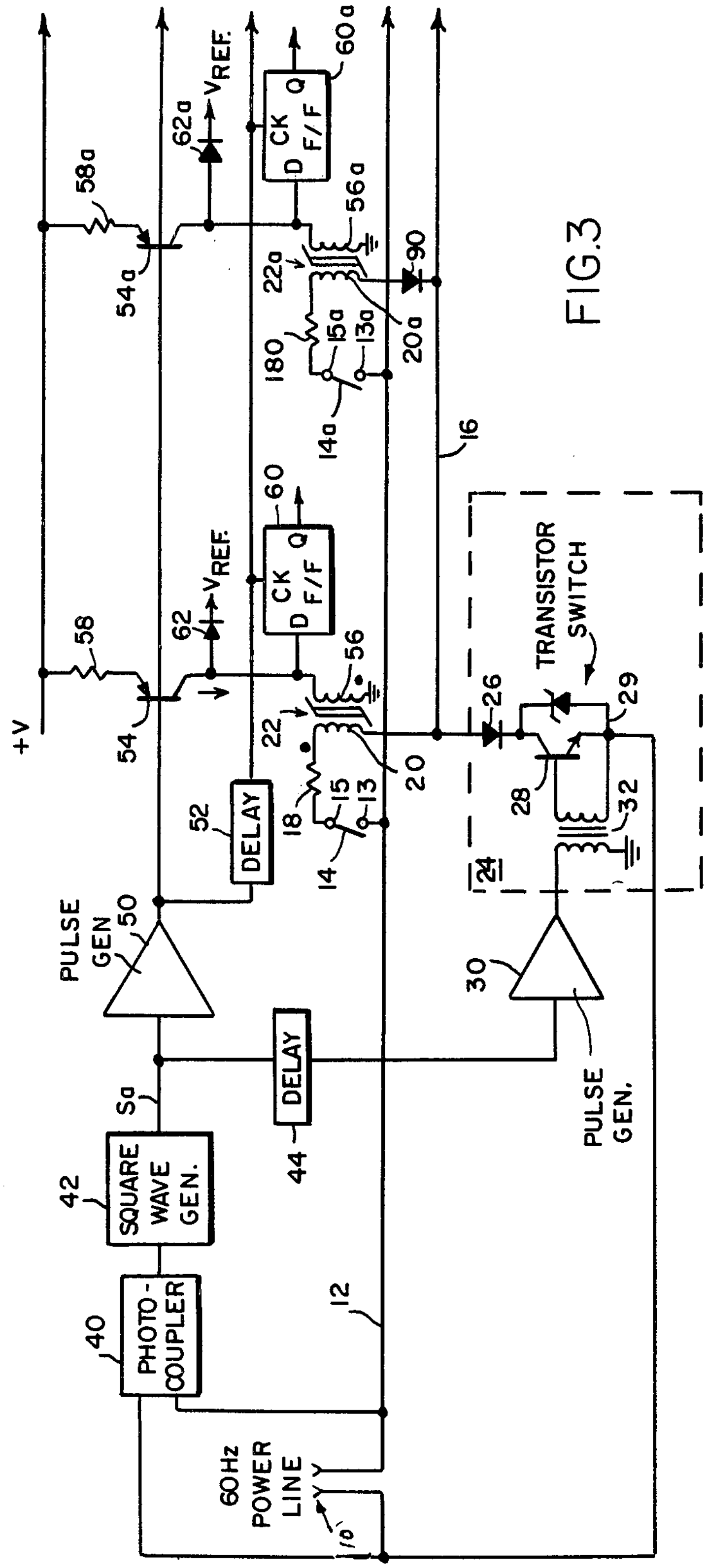
FIG. 3 is a circuit of one embodiment of the present invention.

Referring to FIG. 3, there is shown a circuit diagram of one embodiment of the present invention. A power line signal is applied to two terminals 10. Typically, the power line signal is a 60 Hz 120 volt AC signal. One side of the power line is connected via a bus 12 to the first terminal 13 of a switch 14. The second terminal 15 of switches 14 is connected to a second bus 16 by means of a series connected resistor 18 and the primary winding 20 of a transformer 22. Bus 16 is periodically connected to the other power line by means of a switch circuit 24. When AC power is applied to bus 16, current flows through the primary winding 20 of each of the transformers 22 when the associated switch 14 is closed. If switch 14 is open, no current flows through winding 20. The level of the current flowing through the primary winding is determined by the value of resistor 18.

Switch 24 includes a diode 26 and a transistor switch 28 connected in series between bus 16 and the power lines. A pulse generator 30 applies a pulse of a predetermined width to the primary of a transformer 32. The secondary of transformer 32 is connected between the base and emitter terminals of transistor switch 28 and causes transistor switch 28 to turn on in response to a pulse applied to the primary windings. Transformer 32 serves to isolate the control circuitry from the AC power lines which are connected to transistor 28.

Transistor switch 28 may be a power darlington, such as a U2T713. A high voltage zener diode 29 is connected between the emitter and collector terminals of transistor switch 28 to protect the transistor from high voltage transients of one polarity on the power lines. Diode 26 in series with the collector of transistor 28 together with diode 29 protects the transistor against reverse bias when the polarity of the power line signal reverses.

The 60 Hz power line signal is also applied to a photocoupler 40 or other isolation device. The output from photocoupler 40 is applied to squarewave generator 42. The output of squarewave generator 42 is a 60 Hz squarewave which is in phase with the power line signal. Coupler 40 serves to isolate the following control circuitry from the power line voltage.

The output from squarewave generator 42 is applied to the input of a delay circuit 44, such as a monostable. In response to the squarewave output from squarewave generator 42, delay circuit 44 produces an output pulse of a predetermined width. A pulse generator 30 is triggered by the trailing edge from the output of delay circuit 44, and in response provides a pulse to switching circuit 24 at its output. The squarewave signal from squarewave generator 42 is also applied to a second pulse generator 50. The output from pulse generator 50 is applied to the input of another delay circuit 52.

The collector of a transistor 54 is connected in series with the secondary winding 56 of transformer 22. The emitter of transistor 54 is connected to a positive voltage supply through a resistor 58. Transistor 54 is normally off. In response to a pulse from pulse generator 50, transistor 54 turns on and causes a current to flow through the secondary winding 56 of transformer 22. The magnitude of this current is determined by emitter resistor 58 and the voltage at the output terminal from pulse generator 50.

The junction of secondary winding 56 and the collector of transistor 54 is applied to the D input of a D flip-flop 60. In response to a pulse from pulse generator 50, transistor 54 turns on for a predetermined period of time causing a pulse to flow through the secondary winding 56 of transformer 22. The output from delay circuit 52 clocks D flip-flop 60 a predetermined time after the beginning of the pulse from pulse generator 50. The signal present at the secondary winding of transformer 22 at the time that flip-flop 60 is clocked is determined by whether switch 14 is open or closed, and the Q output of flip-flop 60 represents the current state of the switch 14.

The voltage present at the output from secondary winding 22 is constrained by a diode 62 connected between the collector of transistor 54 and a positive reference voltage, $V_{REF}$. Diode 62 prevents the voltage across the secondary winding of transformer 22 from rising appreciably above the reference voltage.

Transformer 22 includes two windings on a core having a rectangular hysteresis loop. In the embodiment described herein, transformer 22 includes a torodial ferrite core, such as Fair-Rite ½" diameter core No. 59-83-000301. The primary winding is 20 turns around the core, and the secondary is 100 turns around the core. The BH curve of the transformer is as shown in FIG. 2, and, as described above, is highly rectangular.

Figure 4:
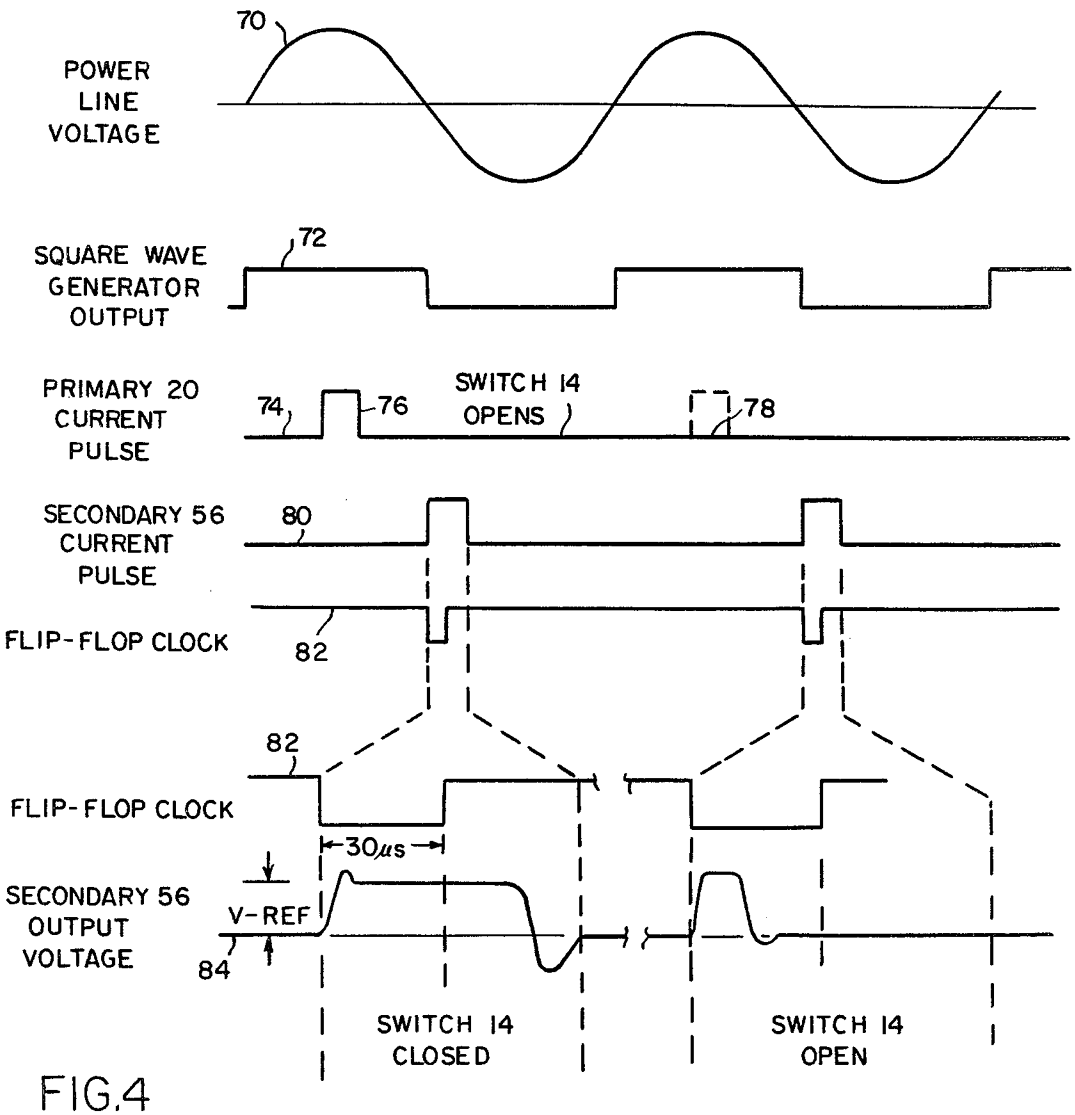
FIGS. 2, 4 and 6 show waveforms useful in explaining the operation of the present invention.

FIG. 4 shows several waveforms useful in describing the operation of the circuit in FIG. 3. (The time scale of these waveforms is not constant for purposes of explanation.) Referring to FIG. 4, the power line voltage is shown by waveform 70, and the resulting output from squarewave generator 42 is shown by waveform 72. Delay circuit 44 is triggered by the rising edge of the squarewave generator output and its delay time is chosen so that pulse generator 30 is triggered just prior to the peak of the power line voltage. This is shown by waveform 74 which represents the current through primary winding 20, in response to the output from pulse generator 30. During the first cycle of the power line signal in FIG. 4, switch 14 is closed and the primary current pulse is as shown by pulse 76. During the second cycle of the power line signal, switch 14 is open and no current flows through the primary winding 20, as shown at 78.

In the presently described embodiment, the delay of delay circuit 44 is approximately 4 milliseconds to cause switch circuit 24 to turn on at the peak of the power line voltage. This results in minimal variation of the voltage applied across primary winding 20, should the timing of the primary current pulse vary slightly. The width of the output pulse from pulse generator 30, and hence the current pulse through primary winding 20, is approximately 500 microseconds. Resistor 18 is approximately 3 kilohms resulting in a current pulse of approximately 50 milliamps through the primary winding 20.

The test current pulse through secondary winding 56 is shown by waveform 80 in FIG. 4. In the presently described embodiment, the secondary current pulse is approximately 70 microseconds long. The length of the secondary current pulse is not critical as long as the secondary current pulse has a fast rise time. The amplitude of the secondary current pulse is determined by resistor 58 and the output voltage from generator 50, and is approximately 15 mA.

Following the leading edge of the secondary current pulse, flip-flop 60 is clocked by the falling edge of the signal from delay circuit 52 applied to its clock input. The flip-flop clock signal is shown by waveform 82 in FIG. 4. The delay time of delay circuit 52 is chosen so that flip-flop 60 is clocked 30 microseconds after the start of the secondary current pulse. The voltage across the secondary winding 56 at the time flip-flop 60 is clocked by the flip-flop clock signal 82 represents the open or closed state of switch 14.

The bottom two waveforms in FIG. 4 are shown in an expanded time frame relative to the waveforms above. Waveform 84 represents the voltage across secondary winding 56 for both open and closed switch conditions. The voltage across the secondary winding is clamped to a relatively low value, typically 5 volts, by diode 62. From equation 2 above, the duration, $\Delta T$, of the output voltage pulse from secondary winding 56 is proportional to the change in flux in the core of the transformer 22.

When switch 14 is closed, the primary current pulse through primary winding 20 saturates the transformer core. When transistor 54 turns on, the current through the secondary winding 56 of transformer 22 saturates the core in the reverse direction in the transformer core. The large change in flux in the transformer produces a relatively long duration voltage pulse across the secondary. This is shown by the left-hand portion of waveform 84 in FIG. 4. In the presently described embodiment, the duration of this pulse is approximately 55 microseconds. The input to flip-flop 60 is at a high level when it is clocked, and the output goes high to indicate a closed switch condition.

If switch 14 opens, no current can flow through the primary winding, and the core remains saturated in the direction of the last test pulse. Since the core is nearly saturated, the next secondary current pulse produces very little change in flux in the transformer core. The resulting voltage pulse across the secondary winding 56 is much shorter and is indicated by the right-hand pulse of waveform 84 in FIG. 4. Typically, this pulse width is 5 to 10 microseconds in duration; and in any event, the voltage across secondary 56 is zero or nearly zero at the time that flip-flop 60 is clocked. Thus, in response to an open switch condition, the output from flip-flop 60 goes low.

The circuit shown in FIG. 3 may be expanded to provide an output indication of the state of a large number of switches. As shown in FIG. 3, the open or closed state of a second switch **14*a* may be determined by means of circuitry essentially identical to that shown for switch 14 and denoted by similar numbers with the suffix "a". As can be seen from FIG. 3, only a few components need be added for each additional switch whose condition is to be monitored. The pulse generator circuits, delay circuits, and switching circuit 24 provide the necessary signals to the additional switch circuits. Each additional switch only requires a current source transistor 54 and associated resistor 58, current limiting resistor 18, transformer 22, diode 62, and flip-flop 60*a***.

A diode 90 may be connected in series between the primary winding 20 of each switch circuit and line 16, as shown in the circuit of switch **14*a*. These diodes isolate the switches and circuits from one another in the event of a short circuit or other similar malfunction. Although not shown, a diode should be similarly connected between line 16 and the primary winding associated with switch 14. If diodes 90 are used, diode 26** is not necessary.

Figure 5:
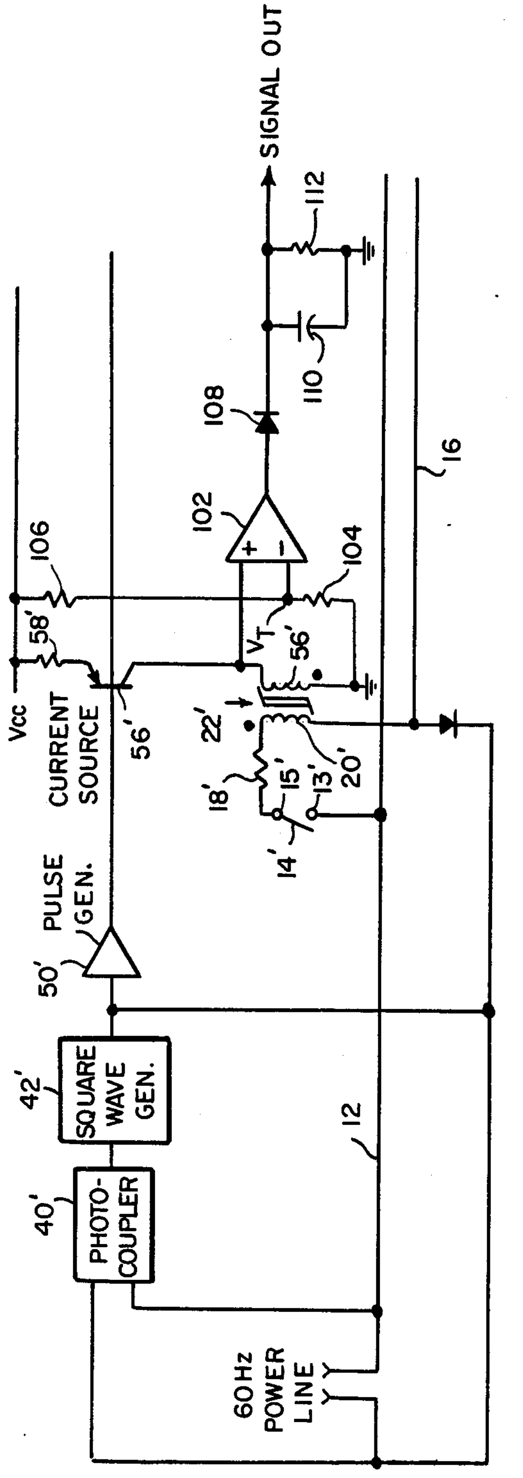
FIG. 5 is a circuit illustrating alternate embodiments.

Referring to FIG. 5, an alternate embodiment of the present invention is shown which differs in several respects from the embodiment shown in FIG. 3. Although FIG. 5 includes several modifications, it should be understood that each of these modifications may be used alone or in combination with other modifications.

In FIG. 5, switching circuit 24 is eliminated, and switch 14' is connected directly across the power line in series with current limiting resistor 18', primary winding 20', and a diode 100. When switch 14' is closed, current flows through primary winding 20 during alternate half-cycles, magnetizing the core of transformer 22. While requiring fewer components than the embodiment shown in FIG. 3, this circuit has increased power dissipation and somewhat less noise immunity.

The voltage across the secondary winding 56' is not constrained in the circuit shown in FIG. 5. In this circuit, the amplitude, rather than the duration, of the voltage across secondary 56 provides an indication of the state of switch 14. This is detected in the following manner.

A comparator 102 has one input biased at a threshold level $V_T$ by a voltage divider including resistors 104 and 106. The output signal from secondary winding 56' is applied directly to the second input of comparator 102. Since the output voltage from winding 56' is not constrained, a pulse having a relatively large amplitude is produced when the flux in transformer 22' reverses. A pulse having a relatively small amplitude is produced when switch 14' is open and the transformer flux does not reverse. The threshold determined by resistors 104 and 106 is selected to distinguish between these two pulse amplitudes.

Figure 6:
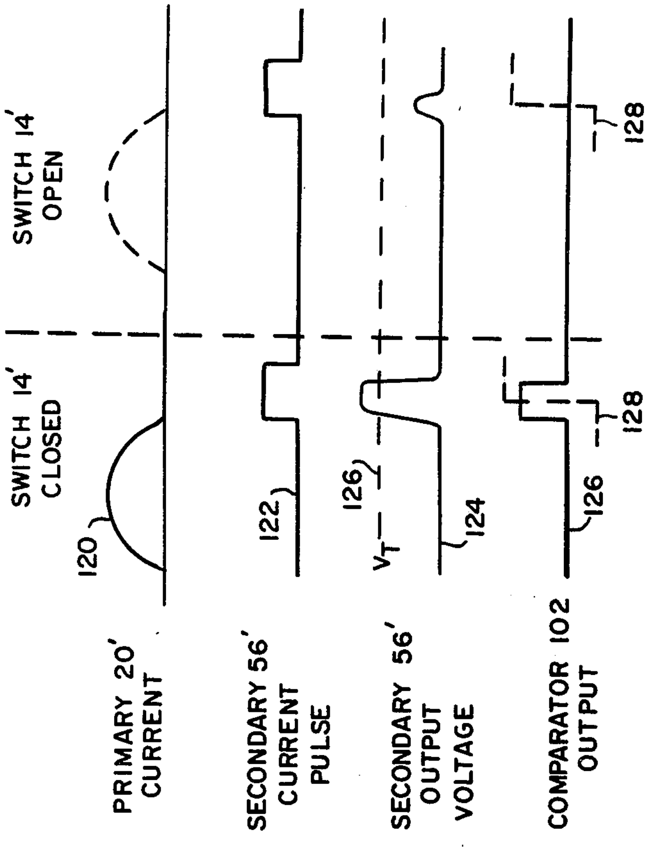

This is shown by the waveforms in FIG. 6. In these waveforms, switch 14' is closed for the left-hand portion of the waveforms and is open for the right-hand portion of the waveforms. Waveform 120 shows the current through primary winding 20'. When switch 14 is closed, alternate half-cycles of the power line produce current flow through the primary winding. When switch 14 is open, no current flows through the primary.

Waveform 122 shows the current pulse from pulse generator 50' through secondary winding 56'. Pulse generator 50' is triggered as the power line signal crosses through zero so that the secondary winding current pulse occurs during the period that no current is flowing through the primary winding 20' of the transformer. Waveform 124 shows the output voltage from secondary winding 56' for both closed and open conditions for switch 14'. The dotted line 126 denotes the threshold level $V_T$ applied to one input of comparator 102. When switch 14' is closed, the secondary output voltage is a pulse having an amplitude which exceeds the threshold level. This is shown by the left-hand portion of waveform 124. When switch 14' is open, the output voltage from secondary 56' is a pulse having a very low amplitude, as shown by the waveform 124. Waveform 126 shows the output of comparator 102 in response to the secondary output voltage shown by waveform 124. As can be seen, a pulse indicates a closed switch condition while an absence of a pulse indicates an open switch condition.

In FIG. 5, the output from comparator 102 is applied via a diode 108 to a capacitor 110. A resistor 112 is connected in parallel with capacitor 110. The RC time constant of capacitor 110 and resistor 112 is chosen such that the voltage on capacitor 110 does not decay substantially during one cycle of the 60 Hz line voltage. This circuit is simpler than the clocked flip-flop circuit shown in FIG. 3, although the response time of the FIG. 5 circuit is longer than when a clocked flip-flop is used. After switch 14' opens, several cycles of the power line signal are required before capacitor 110 discharges through resistor 112 sufficiently to provide an open switch signal. Delay circuit 52 and flip-flop 60 from FIG. 3 may be substituted for the RC circuit of FIG. 5 to provide a more rapid response time. In this case, the flip-flop clock signal would be chosen to occur during the center of the output pulses from secondary winding 56, as shown by dotted lines 128 in FIG. 6.

The present invention has very high immunity to leakage paths across the contacts. Because of the large current required to magnetize the transformer core, the circuit is not sensitive to shunts caused by contamination or cable capacity. The present invention also has very high common mode rejection. All control signals to switch 14 and the associated circuitry and connective cabling are provided through transformer 22 and the transformer 32 in the switching circuit 24, thus providing very high isolation between the control circuitry and the switches 14. Due to the high degree of reproducibility of the transformer characteristics 22, the transformer parameters can be closely controlled in production, eliminating the need for in-circuit adjustments after the circuit has been assembled.

In the embodiment of FIG. 3, switching circuit 24 is closed only during the primary current pulses. Noise pulses in the circuit at other times of the cycle are extremely unlikely to set the core. Strobing primary winding 20 with a low duty-cycle waveform also results in very low power consumption.

It should be appreciated that the voltages used in FIGS. 3 and 5 need not be derived from the AC power lines and can be either AC or DC voltages. Also periodic signals other than the 60 Hz power line signal may be used to provide the timing signals for the circuits.

There has been described a new and unique circuit for providing an indication of the state of a switch while maintaining isolation between the switch and circuitry which is responsive thereto. Modifications of the preferred embodiments disclosed herein will be obvious to those in the art. Accordingly, the disclosure herein of certain embodiments should not be taken as limitations on the present invention, but rather the present invention should only be construed in accordance with the following claims.

What is claimed is:

1. A circuit for detecting the state of a switch and for providing an output representative thereof comprising:

a saturable core having a BH curve characterized by a two state hysteresis loop;

a primary winding on said core;

a secondary winding on said core;

a series circuit formed by series connection of said switch and said primary winding;

pulse means for periodically providing a signal pulse to the series-connected switch and primary winding of said series circuit of sufficient amplitude to cause the core to saturate in a first state of a first polarity when the switch is closed;

test means for periodically applying a test current pulse to the secondary winding to cause the core to saturate in a second state of the opposite polarity; and output means responsive to a voltage induced across said secondary winding on said core in response to said core changing its state of magnetization for providing an output signal representative of the state of the switch.

2. The circuit of claim 1 further including means for constraining the voltage across the secondary winding to produce a secondary voltage pulse in response to the test current pulse whose duration is proportional to the flux change in the transformer core.

3. The circuit of claim 2 wherein the output means includes means, responsive to the secondary voltage at a predetermined time after the beginning of the test pulse, for providing the output signal as a function of the secondary voltage at the predetermined time.

4. The circuit of claim 3 wherein the predetermined time is approximately 30 microseconds after the start of the test pulse.

5. The circuit of claim 3 wherein the output means includes:

a clocked flip-flop having an input connected to the secondary winding; and means for clocking the flip-flop at said predetermined time after the beginning of the test pulse.

6. The circuit of claims 2 or 5 wherein the test means includes a pulsed current source and wherein said means for constraining includes a diode connected between a reference voltage and the secondary winding.

7. The circuit of claim 6 wherein the pulse means includes switch means in series with said series-connected switch and primary winding for periodically applying a voltage pulse to said series-connected switch and primary winding.

8. The circuit of claim 7 wherein voltage pulses and current pulses are alternately provided to the primary winding and secondary winding respectively.

9. The circuit of claim 8 wherein the voltage pulses and current pulses are provided synchronously with an AC power line signal.

10. The circuit of claim 6 wherein the pulse means includes a switching device connected in series across an AC power line with the series-connected primary winding and the switch.

11. The circuit of claim 10 wherein the switching device is momentarily closed for a period which occurs at the peak of each cycle of the AC line signal.

12. The circuit of claims 1, 2, 3, or 5 wherein the current through the primary winding required to saturate the core exceeds the leakage current across the switch.

13. The circuit of claim 1 wherein the output means includes means responsive to the amplitude of the secondary voltage.

14. The circuit of claim 13 wherein the output means includes:

means for setting a threshold voltage; and means for providing an output signal of a first value in response to a secondary voltage less than the threshold voltage and for providing an output signal of second value in response to a secondary voltage greater than the threshold voltage.

15. The circuit of claim 14 wherein the output means includes means, responsive to the secondary voltage at a predetermined time after the beginning of the test pulse, for providing the output signal as a function of the secondary voltage at the predetermined time.

16. The circuit of claim 15 wherein the output means includes:

a clocked flip-flop having an input connected to the output of the threshold means; and means for clocking the flip-flop at the predetermined time after the beginning of the test pulse.

17. The circuit of claim 13 wherein the output means includes:

a clocked flip-flop responsive to the secondary voltage; and means for clocking the flip-flop at a predetermined time after the beginning of the test pulse.

18. The circuit of claim 14 including means responsive to the peak signal from the threshold means for providing the output signal.

19. The circuit of claim 14 wherein the output means further includes:

a diode connected in series with the threshold means output signal;

a resistor and capacitor connected in parallel between a reference voltage and the diode.

20. The circuit of claims 13, 14, or 15 wherein the pulse means includes a switch means in series with the series-connected switch and primary winding, for periodically applying a voltage pulse to said series-connected switch and primary winding.

21. The circuit of claims 13, 14, or 15 wherein the pulse means further includes:

a diode connected in series with said series-connected switch and primary winding; and means for applying an AC power line signal to the series-connected switch, primary winding and diode.

22. The circuit of claim 13 wherein the pulse means includes:

two terminals to which an AC line signal is applied; and control means for periodically allowing current to flow therethrough;

the control means, switch, and primary winding all being connected in series between the two terminals to which the AC signal is applied.

23. The circuit of claim 22 wherein the control means includes an electronically operated switch.

24. The circuit of claim 22 wherein the control means includes a rectifier.

25. The circuit of claims 13, 14, 15, 19 or 22 wherein the current through the primary winding required to saturate the core exceeds the leakage current across the switch.

26. The circuit of claims 1, 2, or 13, wherein the pulse means includes isolation means for providing electrical isolation between the series-connected switch and primary winding and the output signal provided by the output means.

27. The circuit of claim 26 further including:

control means for alternately actuating the pulse means and the test means so that current pulses through the primary winding alternate with current pulses through the secondary winding when the switch is closed.

28. The circuit of claim 27 wherein the isolation means includes a transformer connected between the control means and the pulse means.

29. A circuit for providing an output signal representative of the state of a pair of switch contacts while providing electrical isolation between the switch contacts and the output signal, comprising:

two terminals for application of an AC power line signal;

a saturable core having a BH curve characterized by a two state hysteresis loop;

a primary winding on said core;

a secondary winding on said core;

a switching device responsive to a pulse control signal applied thereto for switching between a conductive and a nonconductive state;

the switch means, the primary winding, and the switch contacts all being connected in a series loop between said terminals to apply a saturating current to set said core to one state if said switch contacts are closed;

means responsive to an AC power line signal applied to the terminals for providing a reference signal representative of the phase of the AC power line signal;

current source means, in series with the secondary winding on said core and responsive to a test pulse signal, for providing a current pulse through the secondary winding to set said core to the other state;

pulse means responsive to the reference signal for providing the pulse control signal and the test pulse signal during selected intervals of the power line signal;

means connected to the secondary winding and responsive to the voltage across the secondary winding generated in response to said core changing its state of magnetization and a clock signal for providing an output signal representative of the state of the switch contacts in response to the voltage across the secondary winding at a time denoted by the clock signal; and means responsive to the reference signal for providing the clock signal a predetermined time after the beginning of the test pulse from the current source.

30. The circuit of claim 29 wherein the switching means includes isolation means responsive to the reference signal for providing the pulse control signal while maintaining electrical isolation between the pulse control signal and the reference signal.

31. The circuit of claim 30 including a diode connected between the secondary winding and reference voltage for constraining the voltage across the secondary winding.

32. The circuit of claims 29 or 31 including current limiting means in series with the switching means, primary winding, and switch contacts for limiting the current through the switch contacts to a value sufficient to saturate the core and greater than the leakage current from the switch contact when the switch contacts are in an open position.

33. The circuit of claim 31 wherein the isolation means includes a transformer.

34. The circuit of claims 1, 5, 33, 13, 16, 23, or 29 wherein the core hysteresis loop is rectangular.

* * * * *